United States Patent [19]

Fujiwara

[11] Patent Number: 5,696,471
[45] Date of Patent: Dec. 9, 1997

[54] INDUCTIVE COUPLED FILTER WITH ELECTRICALLY NEUTRAL HOLES BETWEEN SOLID SPIRAL INDUCTORS

[75] Inventor: Hideki Fujiwara, Ichikawa, Japan

[73] Assignee: Uniden Corporation, Tokyo, Japan

[21] Appl. No.: 560,684

[22] Filed: Nov. 20, 1995

[30] Foreign Application Priority Data

Sep. 22, 1995 [JP] Japan ................. 7-244947

[51] Int. Cl.$^6$ ................................. H03H 7/09
[52] U.S. Cl. ................... 333/177; 333/184; 333/185; 336/200
[58] Field of Search .................. 333/167, 177–185; 336/200

[56] References Cited

U.S. PATENT DOCUMENTS

| | | | |
|---|---|---|---|
| 2,786,984 | 3/1957 | Slate | 336/200 X |
| 4,203,081 | 5/1980 | Braeckelman | 333/185 |
| 4,772,862 | 9/1988 | Kubo et al. | 333/167 |
| 5,461,353 | 10/1995 | Eberhardt | 336/200 X |
| 5,521,573 | 5/1996 | Inoh et al. | 336/200 X |

FOREIGN PATENT DOCUMENTS

| | | | |
|---|---|---|---|
| 2-137009 | 11/1990 | Japan . | |
| 4-296011 | 10/1992 | Japan . | |
| 5190364 | 7/1993 | Japan | 336/200 |
| 5-234811 | 9/1993 | Japan . | |
| 6-36936 | 2/1994 | Japan . | |

*Primary Examiner*—Benny T. Lee
*Assistant Examiner*—Justin P. Bettendorf
*Attorney, Agent, or Firm*—Lowe, Price, LeBlanc & Becker

[57] ABSTRACT

A plurality of inductors are formed by connecting linear patterns formed in different surfaces of a substrate respectively by means of holes, forming a plurality of electrically neutral surfaces in areas not including the linear patterns on different surfaces of the substrate, and furthermore by forming electrically neutral holes connecting the electrically neutral surfaces to each other at positions between the plurality of inductors to affect the coupling between inductors.

8 Claims, 7 Drawing Sheets

MAGNETIC FLUX Fb

MAGNETIC FLUX Fa

FIG. 7C

ELECTRICALLY NEUTRAL SURFACE 102

5,696,471

INDUCTIVE COUPLED FILTER WITH ELECTRICALLY NEUTRAL HOLES BETWEEN SOLID SPIRAL INDUCTORS

FIELD OF THE INVENTION

The present invention relates generally to a lumped constant type of solid spiral inductor, and more particularly to a solid spiral inductor having fine coupling adjustment capabilities. The invention is further related to an inductive coupling filter using the same.

BACKGROUND OF THE INVENTION

As an example of a lumped constant type of solid spiral inductor based on conventional technology, in Japanese Patent Laid-Open No.137009/1990 linear patterns each formed on both sides of a printed circuit board respectively are coupled with through-holes to form an inductor.

Figure 7A:
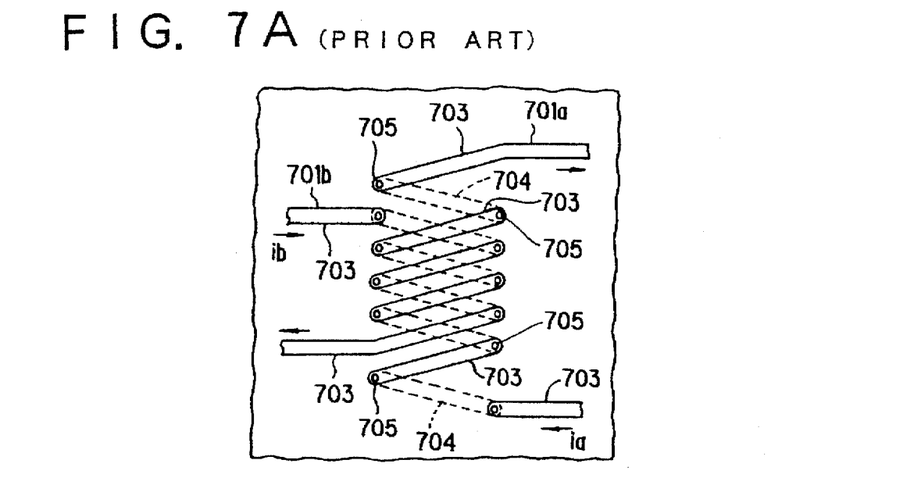
FIG. 7A is a view showing an example of an inductor according to the conventional technology.

FIG. 7A shows an example of a configuration of an inductor based on this conventional technology. In the figure, designated at the reference numerals 701a and 701b each are inductors, at 703 a linear pattern on the surface, at 704 a linear pattern on the rear surface, and at 705 a through-hole. Also herein ia indicates current flowing through the inductor 701a, while ib indicates current flowing through the inductor 701b.

Figure 7B:
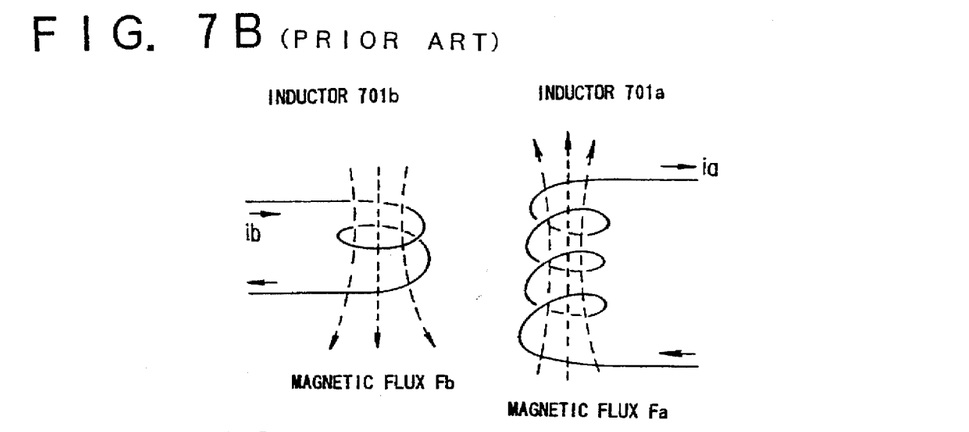
FIG. 7B is a schematic view for explanation of a magnetic flux and induced current in the inductor shown in FIG. 7A.

FIG. 7B is a schematic view for explanation of magnetic flux and induced current in the inductor shown in FIG. 7A. As shown in the figure, when an AC current ib has been flowing in the inductor 701b, a magnetic flux Fb is generated in the direction shown. In this case, an AC current ia is induced so that a magnetic flux Fa offsetting the magnetic flux Fb will be generated in the inductor 701a.

As described above, in the conventional type of solid spiral inductor, all the magnetic flux Fb generated in the inductor 701b interlinks the inductor 701a, so that induced current ia is determined by its number of turns. For this reason, the construction described above is not appropriate for obtaining very small coupling with a low degree of freedom, which causes limitations to arise in forming the inductor on a substrate; this is disadvantageous in actual use. It should be noted that in the present specification, the term "coupling" is used for indicating a means for exchanging energy between one or more resonance systems.

Also in an inductive coupling filter using the conventional type of solid spiral inductor, degree of freedom in coupling is rather low, which is disadvantageous in actual use.

SUMMARY OF THE INVENTION

It is an object of the present invention to provide a solid spiral inductor which can easily make fine adjustments to degree of coupling according to capacity component and mutual inductance components, is excellent in adjustment precision, and also has small loss due to the capacity and mutual inductance components, and furthermore is low in production cost. Another object is to provide an inductive coupling filter using the same.

With the solid spiral inductor according to a first feature of the present invention, a plurality of inductors are formed by coupling linear patterns each formed on different surfaces of a substrate respectively by means of holes. A plurality of electrically neutral surfaces are formed on areas not including the linear patterns respectively on different surfaces of the substrate. Electrically neutral holes coupling a plurality of electrically neutral surfaces are formed between the plurality of inductors, which constitute the solid spiral inductor. By providing electrically neutral surfaces or changing the spacing between inductors, a solid spiral inductor is produced which can easily make fine adjustments to degree of coupling according to mutual inductance between the inductors.

With the inductive coupling filter according to the first feature, the filter is formed by connecting one end of one of the inductors constituting the solid spiral inductors to an input terminal for receiving a specified power supplied thereto, connecting one end of another inductor constituting the solid spiral inductors to an output terminal connected to any load, and connecting the other end of the first inductor and the other end of the other inductor to the electrically neutral surface respectively. By providing electrically neutral surfaces and changing the spacing between inductors, an inductive coupling filter which can easily make fine adjustments to coupling between these inductors, and has small loss due to coupling capacity and mutual inductance components, and furthermore low in production cost, can be provided.

Other objects and features of this invention will become understood from the following description with reference to the accompanying drawings.

BRIEF DESCRIPTION OF THE DRAWINGS

FIG. 2A is a circuit diagram showing an equivalent circuit of the inductive coupling filter according to Embodiment 1, while

FIG. 4A is a circuit diagram showing an equivalent circuit of the inductive coupling filter according to Embodiment 2, while

FIG. 6A is a circuit diagram showing an equivalent circuit of the inductive coupling filter according to Embodiment 3, while

DESCRIPTION OF THE PREFERRED EMBODIMENTS

Detailed description is made hereinafter for an outline of a solid spiral inductor and an inductive coupling filter using the same according to the present invention. Embodiments of the solid spiral inductor and the inductive coupling filter using the same with reference to the related drawings are described in the order of Embodiment 1, Embodiment 2, and Embodiment 3.

Figure 1:
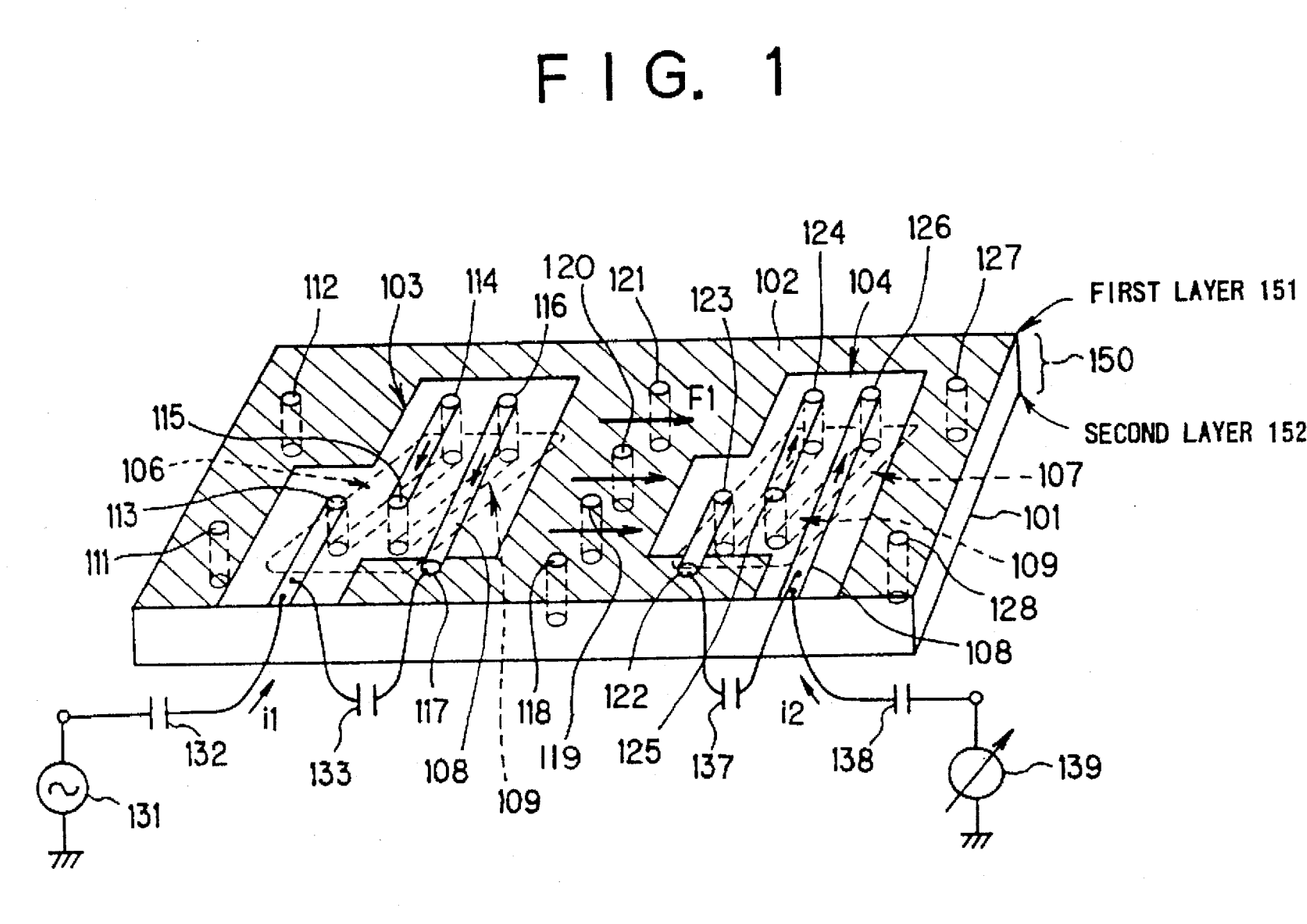
FIG. 1 is a perspective view showing a solid spiral inductor and an inductive coupling filter using the same according to Embodiment 1 of the present invention.
Figure 2A:
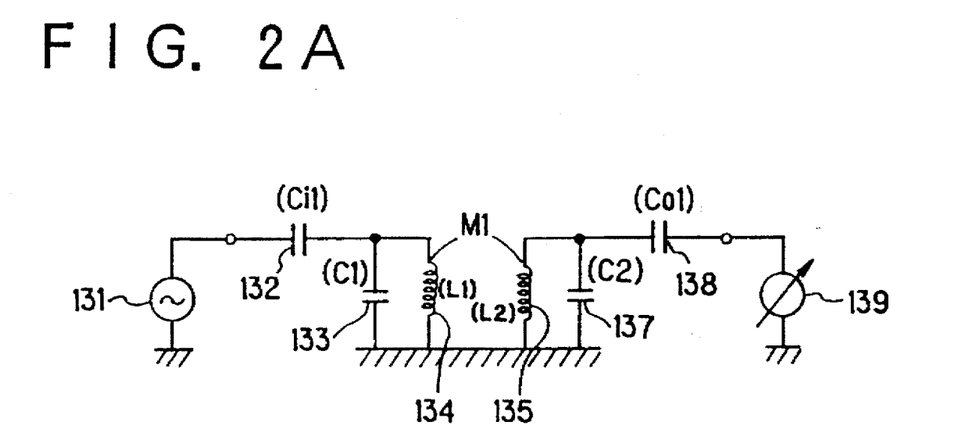
Figure 2B:
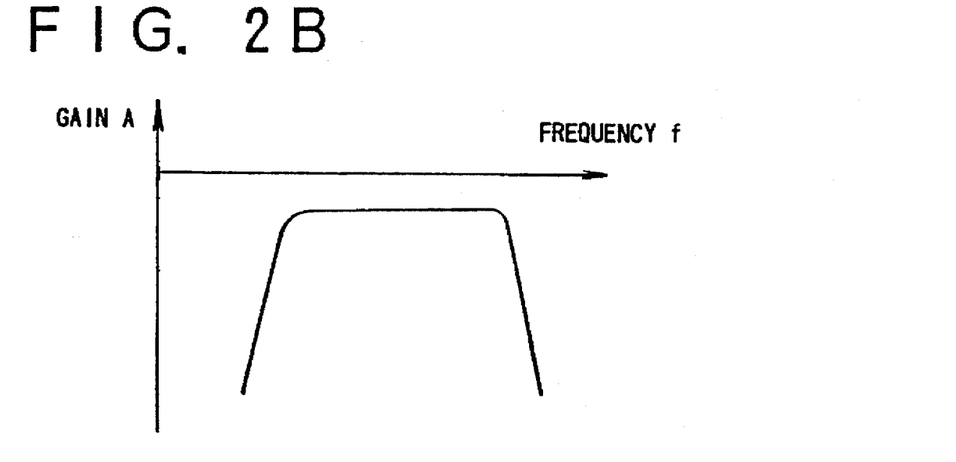
FIG. 2B is a frequency characteristic diagram for the inductive coupling filter according to Embodiment 1.

In a solid spiral inductor device according to a first feature of the present invention, as shown in FIG. 1 and FIGS. 2A and 2B, a plurality of inductors 134 and 135 each are formed by coupling linear patterns 108 and 109 each formed on different surfaces of a substrate respectively to holes 113 to 116 and 123 to 126, and a plurality of electrically neutral surfaces 102 (the rear surface is not shown herein) are formed on areas each not including the linear patterns 108 and 109, respectively on different surfaces of the substrate (a first layer 151 and a second layer 152). Furthermore, electrically neutral holes 118 to 121 coupling a plurality of electrically neutral surfaces 102 are formed in places each between a plurality of inductors 134 and 135, which form the solid spiral inductor. The holes 113 to 116 and 123 to 126 each are realized with through-holes or slits.

Figure 7C:
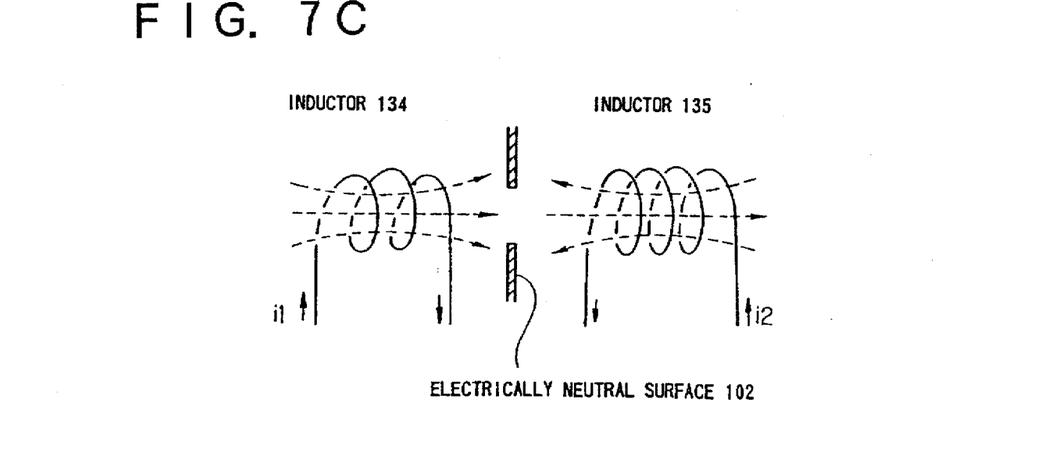
FIG. 7C is a schematic view for explanation of magnetic flux and induced current in the solid spiral inductor according to the first feature of the present invention.

FIG. 7C is a schematic view for explanation of magnetic flux and induced current in the solid spiral inductor according to the first feature of the present invention. As shown in the figure, when an AC current i1 is flowing in the inductor 134, a magnetic flux is generated in the direction shown in the figure. In this case, an AC current i2 is induced so that a magnetic flux offsetting the magnetic flux according to the inductor 134 will be generated in the inductor 135. However, the magnetic flux is not thoroughly shared by the two inductors, so that by providing the electrically neutral surface 102 and changing the spacing between the inductors 134 and 135, the degree of coupling between the inductors 134 and 135 can be adjusted, and the various requirements in actual use can easily be satisfied therewith. Namely, a solid spiral inductor which can easily make fine adjustments to degree of coupling according to mutual inductance, is excellent in adjustment precision, has only small loss due to mutual inductance, and furthermore is inexpensive to realized. Furthermore, a shield effect can be obtained by providing an electrically neutral surface 102.

In a solid spiral inductor device according to a second feature of the present invention, as shown in FIG. 1 and FIG. 2, by changing each spacing between a plurality of inductors 134 and 135, a number of electrically neutral holes 118 to 121, and/or a cross sectional area of each of the electrically neutral holes 118 to 121, the degree of coupling between a plurality of inductors 134 and 135 is adjusted. With this operation, a solid spiral inductor which can precisely and easily make fine adjustments to degree of coupling according to the mutual inductance component, is large in design flexibility, and can easily accommodate various types of restriction in actual use, can be realized.

Also an inductive coupling filter according to the first feature is formed, as shown in FIG. 1 and FIGS. 2A and 2B, by connecting one end of one of the inductors 134 constituting the solid spiral inductors according to the present invention to an input terminal for receiving a specified power source 131 supplied thereto, connecting one end of another inductor 135 constituting the solid spiral inductor to an output terminal connected to any load 139, and also by connecting the other end of one of the inductors 134 and the other end of the other inductor 135 to the electrically neutral surface 102 respectively.

In a case of configuration with two inductors as shown in FIG. 1, a configuration with a band-pass filter as shown in FIG. 2A is attained. However, to reduce insertion loss, a small amount of coupling is required between a plurality of inductors 134 and 135, between one end of one of the inductor 134 and an input terminal, and also between one end of other inductor 135 and an output terminal. In the inductive coupling filter according to the first feature, by providing an electrically neutral surface 102 and changing the spacing between the inductors 134 and 135, an inductive coupling filter which can easily make fine adjustments to these couplings, has small loss due to coupling capacity and mutual inductance components, and furthermore is low in production cost, can be realized. Furthermore, an inductive coupling filter excellent in shield characteristics can be realized by providing an electrically neutral surface 102.

In an inductive coupling filter according to the second feature, as shown in FIG. 1 and FIGS. 2A and 2B, by changing each spacing between a plurality of inductors 134 and 135, a number of electrically neutral holes 118 to 121, and/or each cross sectional area of electrically neutral holes 118 to 121, coupling between a plurality of inductors 134 and 135, between one end of one of the inductors 134 and an input terminal, and between one end of other inductor 135 and an output terminal are adjusted. With this operation, an inductive coupling filter which can precisely and easily make fine adjustments to degree of coupling due to coupling capacity and mutual inductance components, is large in design flexibility, and can easily accommodate various types of restriction on an actual use, can be realized.

FIG. 1 is a perspective view showing a solid spiral inductor device and an inductive coupling filter using the same according to Embodiment 1 of the present invention. It should be noted that the inductive coupling filter in this embodiment constitutes a band-pass filter.

In the figure, the solid spiral inductor in this embodiment is formed on a two-layered substrate 150 comprising a first layer 151 and a second layer 152, and comprises an inductor 134 formed by coupling a linear pattern 108 formed in an area 103 on the first layer 151 to a linear pattern 109 formed in an area 106 on the second layer 152 by means of holes (through-holes) 113 to 116, an inductor 135 formed by coupling a linear pattern 108 formed in an area 104 on the first layer 151 to a linear pattern 109 formed in an area 107 on the second layer 152 by means of holes (through-holes) 123 to 126, electrically neutral holes 111, 112, 118 to 121, 127 and 128 coupling an electrically neutral surface 102 excluding the areas 103 and 104 of the first layer 151 to an electrically neutral surface excluding the areas 106 and 107 of the second layer 152.

As described above, when an AC current i1 is flowing in the inductor 134, a magnetic flux is generated in the direction of F1 shown in the figure. In this case, an AC current i2 is induced so that a magnetic flux offsetting the magnetic flux generated by the inductor 134 will be generated in the inductor 135. However, the magnetic flux is not thoroughly shared by the two inductors, so that by providing the electrically neutral surface 102 and electrically neutral holes 111, 112, 118 to 121, 127 and 128, an adjustment to degree of coupling according to mutual inductance between the inductors 134 and 135 can be made, and also a loss of energy due to mutual inductance can be reduced. Furthermore, a shield effect can be obtained by providing an electrically neutral surface 102.

The inductive coupling filter in this embodiment is formed by connecting one end of the inductor 134 constituting the solid spiral inductors to an input terminal for receiving a power source 131 supplied thereto, connecting one end of the inductor 135 to an output terminal connected to the load 139, and connecting the other end of the inductor 134 as well as the other end of the inductor 135 to the electrically neutral surface 102 respectively.

FIG. 2A is a diagram showing an equivalent circuit for the inductive coupling filter in this embodiment. In the figure, a capacitor 132 indicates coupling capacity (Ci1) between one end of the inductor 134 and the input side (power source 131), capacitor 138 indicates a coupling capacity (Co1)

between one end of the inductor 135 and the output side (load 139), capacitor 133 indicates a floating capacity (C1) between one end of the inductor 134 and the electrically neutral surface 102, and capacitor 137 indicates a floating capacity (C2) between one end of the inductor 135 and the electrically neutral surface 102. Also, M indicates a mutual inductance between the inductors 134 and 135.

Generally, it is required to design a band-pass filter for the purpose of reducing an inserting loss, so that it couples to a resonance circuit by the capacity C1 and an inductance L1 as well as to a resonance circuit by a capacity C2 and an inductance L2 according to a small impedance to a non-load Q value, and a load Q value (an external Q value) is not decreased. For this reason, such values as coupling capacities Ci1, Co1, and mutual inductance M should preferably be as small as possible.

In the inductive coupling filter according to the present embodiment, by providing an electrically neutral surface 102 and electrically neutral holes 111, 112, 118 to 121, 127 and 128, coupling between the inductors 134 and 135, between one end of the inductor 134 and an input side, and between one end of the inductor 135 and output side are adjusted, so that fine adjustments to degree of coupling according to coupling capacity and mutual inductance components can precisely and easily be made, and also loss due to these components can be reduced.

FIG. 2B shows frequency characteristics of the inductive coupling filter according to this embodiment.

Figure 3:
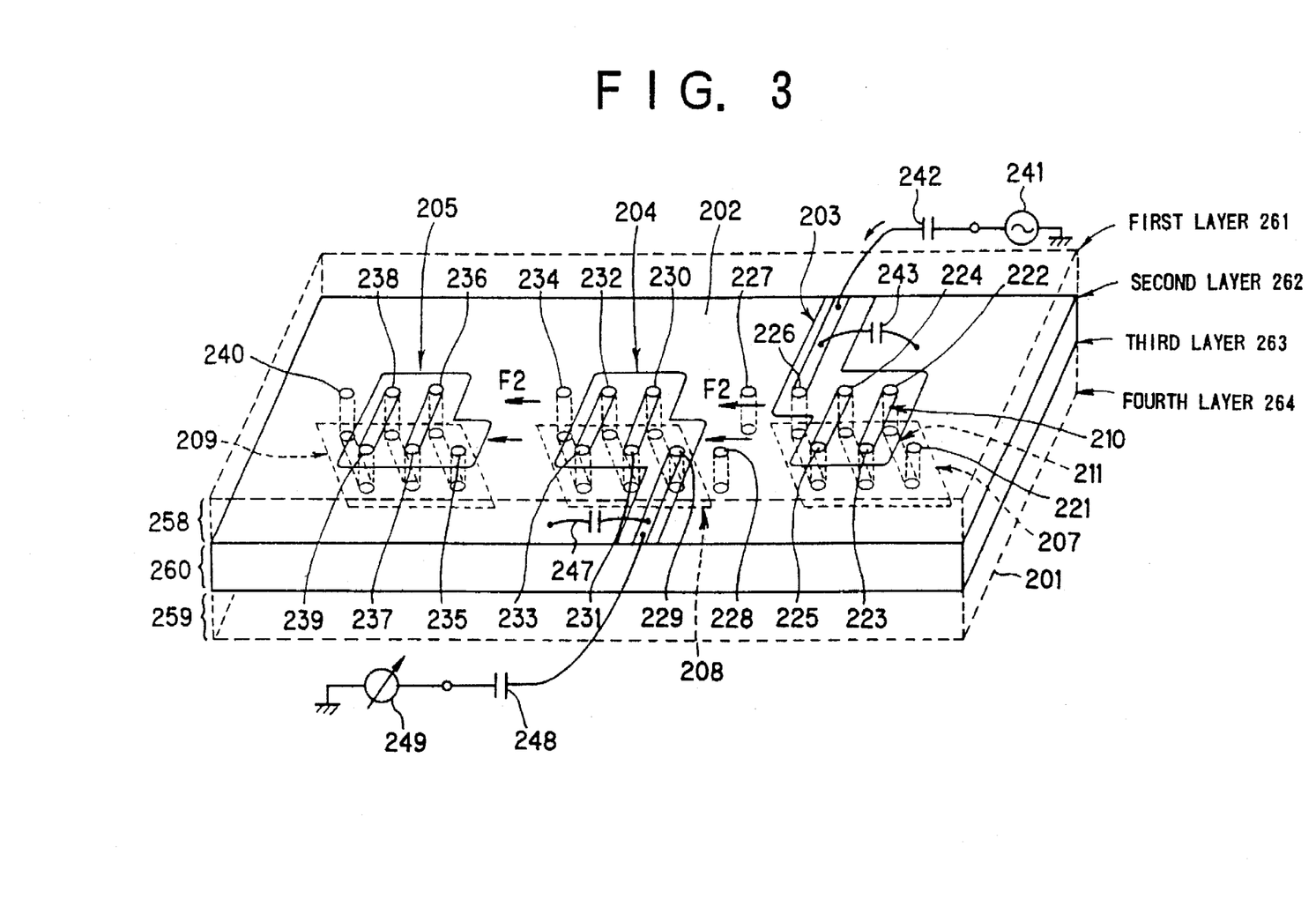
FIG. 3 is a perspective view showing a solid spiral inductor and an inductive coupling filter using the same according to Embodiment 2 of the present invention.

FIG. 3 is a perspective view showing a solid spiral inductor device and an inductive coupling filter using the same according to Embodiment 2 of the present invention. It should be noted that the inductive coupling filter of this embodiment constitutes a band-pass filter BPF and a band-elimination filter BEF.

Figure 4A:
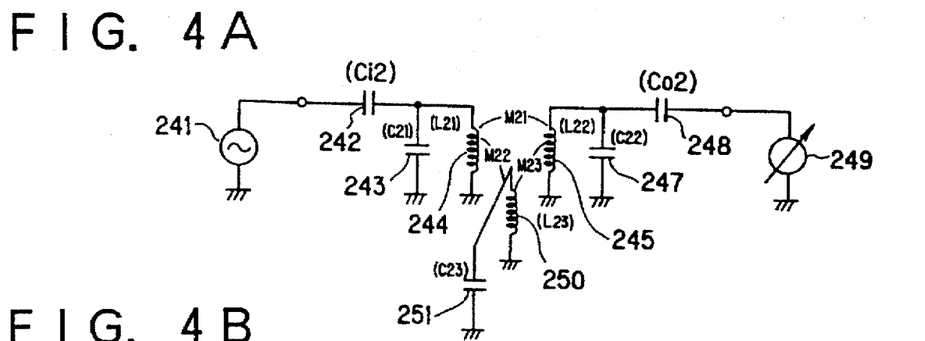

In the figure, the solid spiral inductor in this embodiment is formed on a four-layered substrate 258, 259 and 260 comprising a first layer 261 and a second layer 262, a third layer 263, and a fourth layer 264, and comprises, with reference to FIG. 4A, an inductor 244 formed by coupling a linear pattern 210 formed in an area 203 on the second layer 262 to a linear pattern 211 formed in an area 207 on the third layer 263 by means of holes (through-holes) 221 to 226, an inductor 245 formed by coupling a linear pattern 210 formed in an area 204 on the second layer 262 to a linear pattern 211 formed in an area 208 on the third layer 263 by means of holes (through-holes) 229 to 234, an inductor 250 formed by coupling a linear pattern 210 formed in an area 205 on the second layer 262 to a linear pattern 211 formed in an area 209 on the third layer 263 by means of holes (through-holes) 235 to 240, electrically neutral holes 227 and 228 coupling between an electrically neutral surface 202 excluding the areas 203, 204, and 205 of the second layer 262 and an electrically neutral surface excluding the areas 207, 208, and 209 of the third layer 263.

When AC current is flowing in the inductor 244, magnetic flux is generated in the direction of F2 shown in the figure. However, by providing an electrically neutral surface 202 and electrically neutral holes 227 and 228, adjustment to degree of coupling among inductors 244, 245 and 250 according to mutual inductance can be made, and also loss due to mutual inductance component can be reduced. A shield effect can also be obtained by providing an electrically neutral surface 102. In addition, the shield effect can further be improved by making the first layer 261 and the fourth layer 264 as electrically neutral surfaces respectively.

The inductive coupling filter in this embodiment is formed by connecting one end of the inductor 244 constituting the solid spiral inductors to an input terminal for receiving a power source 241 supplied thereto, connecting one end of the inductor 245 to an output terminal connected to a load 249, and connecting the other end of the inductor 244, the other end of the inductor 245, and the other end of the inductor 250 to the electrically neutral surface 202 respectively.

FIG. 4A is a diagram showing an equivalent circuit for the inductive coupling filter in this embodiment. In the figure, capacitor 242 indicates a coupling capacity (Ci2) between one end of the inductor 244 and the input side (the power source 241), capacitor 248 indicates a coupling capacity (Co2) between one end of the inductor 245 and the output side (the load 249), capacitor 243 indicates a floating capacity (C21) between one end of the inductor 244 and the electrically neutral surface 202, and capacitor 247 indicates a floating capacity (C22) between one end of the inductor 245 and the electrically neutral surface 202, and capacitor 251 indicates a floating capacity (C23) between one end of the inductor 250 and the electrically neutral surface 202. Also, M12 indicates a mutual inductance between the inductors 244 and 245, M13 indicates one between the inductors 244 and 250, and M32 indicates one between the inductors 250 and 245, respectively.

As in Embodiment 1, such values as the coupling capacities Ci2, Co2, and of the mutual inductance M12 should preferably be as small as possible in this embodiment. By providing an electrically neutral surface 202 and electrically neutral holes 227 and 228, coupling between the inductors 244 and 245, between one end of the inductor 244 and an input side, and between one end of the inductor 245 and an output side are adjusted, so that fine adjustments to degree of coupling according to coupling capacity and a mutual inductance components can precisely and easily be made, and loss due to these coupling capacity and mutual inductance components can also be reduced.

Figure 4B:
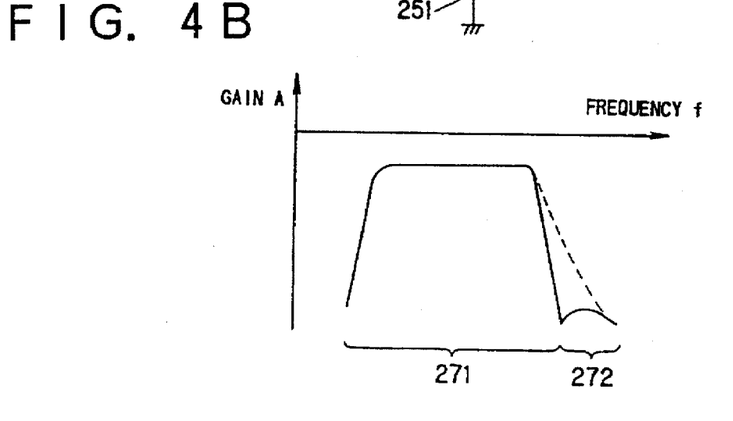
FIG. 4B is a frequency characteristic diagram for the inductive coupling filter according to Embodiment 2.

FIG. 4B shows frequency characteristics of the inductive coupling filter according to this embodiment. In the figure, a band 271 indicates partial characteristics of the band-pass filter BPF, and a band 272 indicates partial characteristics of the band-elimination filter BEF respectively.

Figure 5:
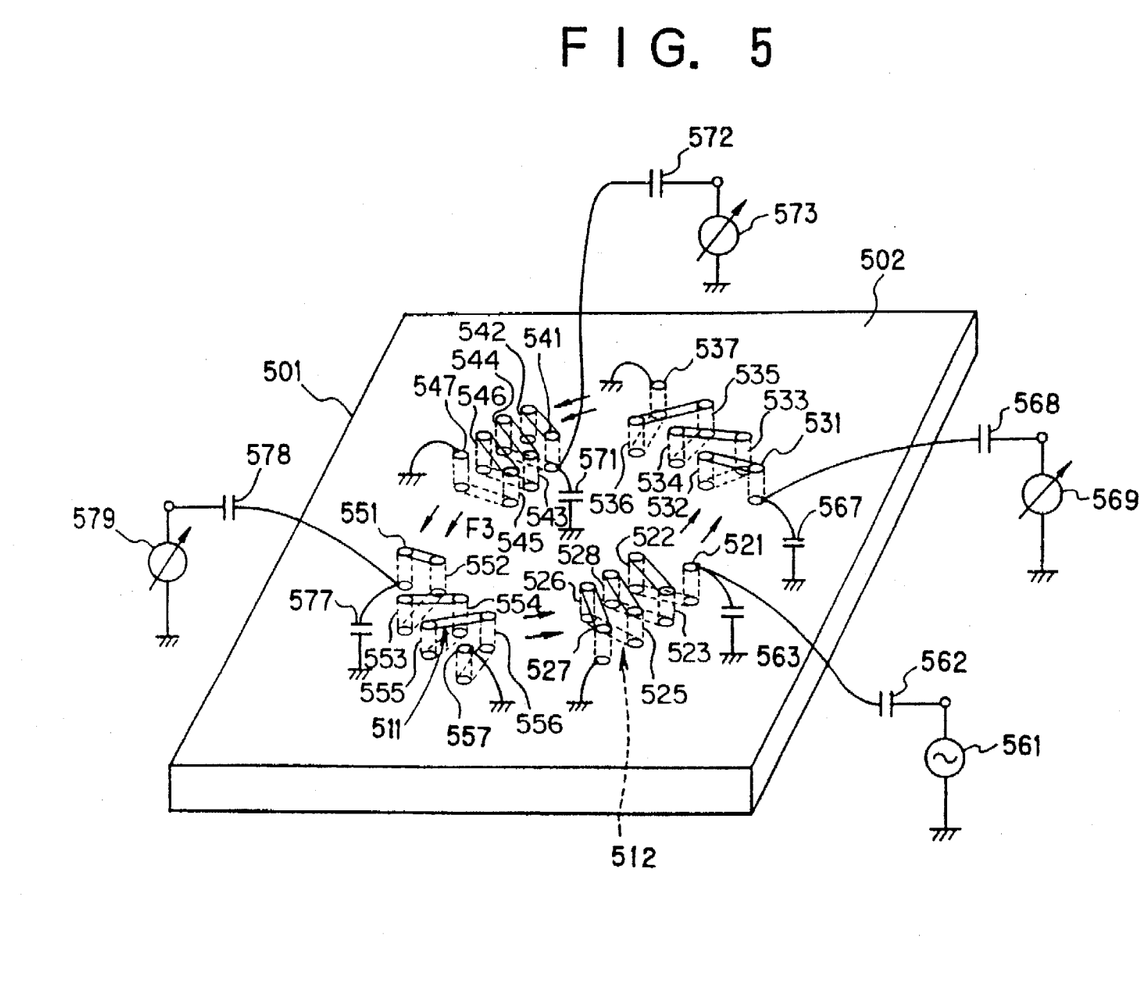
FIG. 5 is a perspective view showing the inductive coupling filter according to Embodiment 3 of the present invention.

FIG. 5 is a perspective view showing an inductive coupling filter according to Embodiment 3 of the present invention. It should be noted that the inductive coupling filter in this embodiment constitutes a multiplexer having therein three band-pass filters BPF of a first, a second, and a third ones, and having a function to divide an input signal into three signals each passing through an independent frequency band.

Figure 6A:
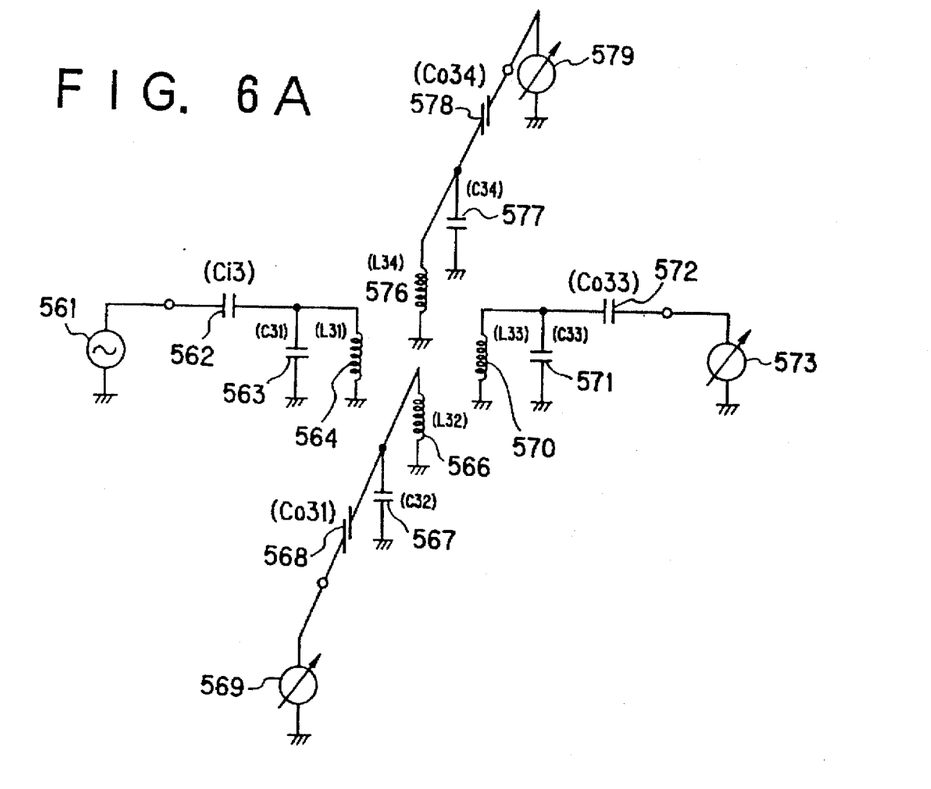

In the figure, the inductive coupling filter in this embodiment has four inductors formed on a two-layered substrate. As shown in FIG. 5 and FIG. 6A, an inductor 564 is formed by coupling a linear pattern 511 formed on a surface layer to a linear pattern 512 formed on a rear layer by means of holes (through-holes) 521 to 527, an inductor 566 is formed by coupling a linear pattern 511 formed on the surface layer to a linear pattern 512 formed on the rear layer by means of holes (through-holes) 531 to 537, an inductor 570 is formed by coupling a linear pattern 511 formed on the surface layer to a linear pattern 512 formed on the rear layer by means of holes (through-holes) 541 to 547, and an inductor 576 is formed by coupling a linear pattern 511 formed on the surface layer to a linear pattern 512 formed on the rear layer by means of holes (through-holes) 551 to 557. It should be noted that electrically neutral holes coupling between an electrically neutral surface 502 excluding an area of a pattern 511 in the surface layer and an electrically neutral surface excluding an area of pattern 512 in the rear layer are not shown herein. However, the holes are supposed to be formed in places each between the inductors as in Embodiment 1.

The inductive coupling filter in this embodiment is formed by connecting one end of the inductor 564 to an input terminal for receiving power source 561 supplied thereto, connecting one end of the inductor 566 to an output terminal connected to a load 569, connecting one end of the inductor 570 to an output terminal connected to a load 573, connecting one end of the inductor 576 to an output terminal connected to a load 579, connecting the other end of the inductor 564, the other end of the inductor 566, the other end of the inductor 570, and the other end of the inductor 576 to the electrically neutral surface 502 respectively.

FIG. 6A is a circuit diagram showing an equivalent circuit for the inductive coupling filter in this embodiment. In the figure, capacitor 562 indicates coupling capacity (Ci3) between one end of the inductor 564 and the input side (the power source 561), capacitor 568 indicates coupling capacity (Co31) between one end of the inductor 566 and the output side (the load 569), capacitor 572 indicates coupling capacity (Co33) between one end of the inductor 570 and an output side (the load 573), and capacitor 578 indicates coupling capacity (Co34) between one end of the inductor 576 and an output side (the load 579), and capacities 563, 567, 571, and 577 each indicate floating capacities (C31, C32, C33, and C34) between each of one ends of the inductors 564, 566, 570, and 576 and the electrically neutral surface 502, respectively. It should be noted that description for mutual inductances is omitted herein.

As in Embodiment 1, such values as those of the coupling capacities Ci3, Co31, Co33, and Co34 and of the mutual inductance should preferably be as small as possible also in this embodiment. By providing an electrically neutral surface 502 and electrically neutral holes, coupling between the inductors 564, 566, 570, and 576, between the inductor and an input side, and between the inductor and an output side are adjusted, so that fine adjustments to degree of coupling according to coupling capacity and a mutual inductance components can precisely and easily be made, loss due to these components can also be reduced, and a multiplexer having excellent characteristics can be realized.

Figure 6B:
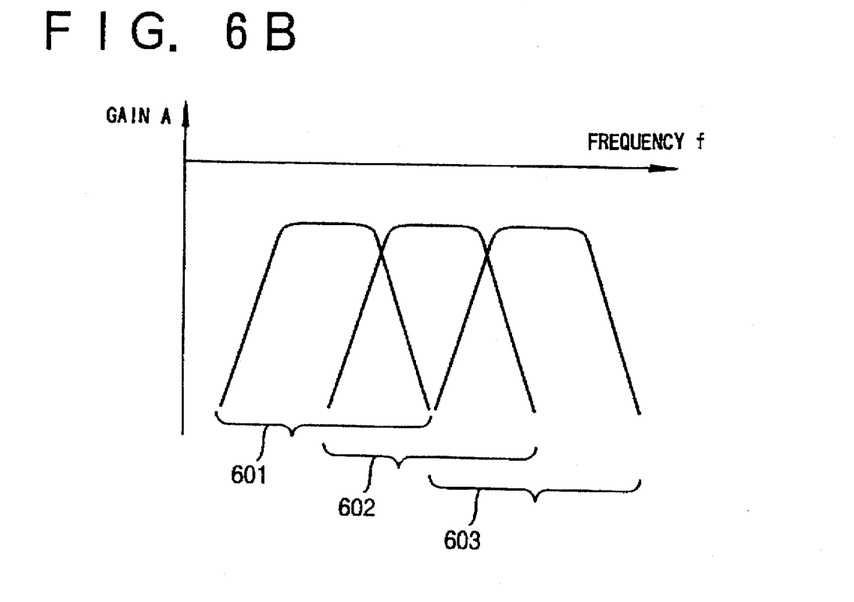
FIG. 6B is a frequency characteristic diagram for the inductive coupling filter according to Embodiment 3.

FIG. 6B shows frequency characteristics of the inductive coupling filter according to this embodiment. In the figure, a band 601 indicates partial characteristics of the first band-pass filter BPF, a band 602 indicates partial characteristics of the second band-pass filter BPF, and a band 603 indicates partial characteristics of the third band-pass filter BPF respectively.

As described above, with the solid spiral inductor device according to the first feature of the present invention, a plurality of inductors are formed by coupling linear patterns each formed on different surfaces of a substrate respectively by means of holes, and a plurality of electrically neutral surfaces are formed on areas each not including the linear patterns respectively on different surfaces of the substrate. Electrically neutral holes coupling a plurality of electrically neutral surfaces are formed in places each between the plurality of inductors, which constitute the solid spiral inductor. By providing electrically neutral surfaces or changing the spacing between inductors, a solid spiral inductor which can easily make fine adjustments to degree of coupling according to mutual inductance between inductors, is excellent in adjustment precision, and small loss due to mutual inductance, and furthermore is low in production cost, can be provided.

With the solid spiral inductor device according to the second feature of the present invention, by changing each spacing between a plurality of inductors, a number of electrically neutral holes, and/or a cross sectional area in each of the electrically neutral holes, coupling between a plurality of inductors is adjusted. For this reason, a solid spiral inductor which can precisely and easily make fine adjustments to degree of coupling according to mutual inductance, is large in design flexibility, and can easily accommodate various types of restriction in actual use, can be provided.

With the inductive coupling filter according to the first feature, the inductive coupling filter is formed by connecting one end of one of the inductors constituting the solid spiral inductors according to the present invention to an input terminal for receiving a specified power supplied thereto, connecting one end of another inductor constituting the solid spiral inductors to an output terminal connected to any load, and by connecting the other end of one of the inductors and the other end of the other inductor to the electrically neutral surface respectively, and by providing electrically neutral surfaces and changing the spacing between inductors, an inductive coupling filter which can easily make fine adjustments to coupling between these inductors, and has small loss due to coupling capacity and mutual inductance components, and furthermore is low in production cost, can be provided.

With the inductive coupling filter according to the second feature, by changing each spacing between a plurality of inductors, a number of electrically neutral holes, and/or each cross sectional area in electrically neutral holes, coupling between a plurality of inductors, between one end of one of the inductors and an input terminal, and between one end of other inductor and an output terminal are adjusted. For this reason, an inductive coupling filter which can precisely and easily make fine adjustments to degree of coupling due to coupling capacity and mutual inductance components, is large in design flexibility, and can easily accommodate various types of restriction on actual use, can be provided.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A solid spiral inductor device comprising:

a plurality of inductors respectively including linear patterns each of the patterns being formed on different surfaces of a substrate and coupled by holes;

a plurality of electrically neutral surfaces each formed in areas not including said linear patterns respectively on different surfaces of said substrate; and electrically neutral holes each located between respective ones of the plurality of said inductors and coupling respective ones of plurality of said electrically neutral surfaces to each other;

wherein by changing at least one of a spacing between respective ones of the plurality of said inductors, a number of said electrically neutral holes, and a cross sectional area of each of said electrically neutral holes, coupling between the plurality of said inductors is adjusted.

2. An inductive coupling filter comprising:

a solid spiral inductor which includes a plurality of inductors respectively having linear patterns each formed on different surfaces of a substrate and coupled by holes, a plurality of electrically neutral surfaces each formed in areas not including said linear patterns respectively on different surfaces of said substrate, and electrically neutral holes each located between respective ones of the plurality of said inductors and coupling respective ones of the plurality of said electrically neutral surfaces to each other;

an input terminal connected to one end of one of said inductors and for supplying thereto a specified power; and an output terminal connected to one end of another one of said inductors and connected to any load;

wherein the other end of said one of said inductors and the other end of said another one of said inductors each are connected to said electrically neutral surfaces respectively;

wherein by changing at least one of spacing between respective ones of the plurality of said inductors, a number of said electrically neutral holes, and a cross sectional area of each of said electrically neutral holes, coupling between said plurality of inductors, between one end of the one of said inductors and said input terminal, and between one end of the another one of said inductors and said output terminal are adjusted.

3. A solid-state inductor device comprising:

a substrate having first and second surfaces;

a plurality of first strips formed in a first area of the substrate on the first surface;

a plurality of second strips formed in the first area of the substrate on the second surface between projections of the first strips, a plurality of first holes being provided in the substrate coupling the first strips and the second strips;

a plurality of third strips formed in a second area of the substrate on the first surface;

a plurality of fourth strips formed in the second area of the substrate on the second surface between projections of the third strips, a plurality of second holes being provided in the substrate coupling the third strips and the fourth strips;

a first electrically neutral region formed on the first surface so as to separate the first area from the second area; and a second electrically neutral region formed on the second surface so as to separate the first area from the second area, a plurality of electrically neutral holes being provided in the substrate between the first electrically neutral region and the second electrically neutral region to adjust coupling capacity and mutual inductance between the strips in the first area and the strips in the second area.

4. The inductor device of claim 3, wherein AC current supplied to the strips in the first area generates magnetic flux in the substrate directed from the first area to the second area.

5. The inductor device of claim 3, further comprising:

a plurality of fifth strips formed in a third area of the substrate on the first surface;

a plurality of sixth strips formed in the third area of the substrate on the second surface between projections of the fifth strips, a plurality of third holes being provided in the substrate coupling the fifth strips and the sixth strips;

third and fourth electrically neutral regions respectively formed on the first and second surfaces so as to separate the third area from the second area.

6. The inductor device of claim 5, wherein Ac current supplied to the strips in the first area generates magnetic flux in the substrate directed from the first area to the second area, and from the second area to the third area.

7. The inductor device of claim 5, further comprising a first outside layer covering the first surface.

8. The inductor device of claim 7, further comprising a second outside layer covering the second surface.

* * * * *